United States Patent
Schmid et al.

(10) Patent No.: US 9,013,623 B2
(45) Date of Patent: Apr. 21, 2015

(54) COLOR IMAGE SENSOR

(71) Applicants: Michael Schmid, Erlangen (DE); Stephan Gick, Rattelsdorf (DE)

(72) Inventors: Michael Schmid, Erlangen (DE); Stephan Gick, Rattelsdorf (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 40 days.

(21) Appl. No.: 13/714,491

(22) Filed: Dec. 14, 2012

(65) Prior Publication Data
US 2013/0100321 A1    Apr. 25, 2013

Related U.S. Application Data

(63) Continuation of application No. PCT/EP2011/059820, filed on Jun. 14, 2011.

(30) Foreign Application Priority Data

Jun. 15, 2010  (DE) .......................... 10 2010 030 108

(51) Int. Cl.
| | |
|---|---|
| *G03B 7/00* | (2014.01) |
| *H04N 5/235* | (2006.01) |
| *H04N 9/04* | (2006.01) |
| *H01L 27/146* | (2006.01) |
| *H04N 5/355* | (2011.01) |

(52) U.S. Cl.
CPC .......... *H04N 9/045* (2013.01); *H01L 27/14621* (2013.01); *H01L 27/14645* (2013.01); *H04N 5/355* (2013.01)

(58) Field of Classification Search
USPC .................................. 348/362, 340, 270–280
See application file for complete search history.

(56) References Cited

U.S. PATENT DOCUMENTS

| | | | |
|---|---|---|---|
| 5,105,264 A | 4/1992 | Erhardt | |
| 5,142,414 A | 8/1992 | Koehler | |
| 5,335,013 A | 8/1994 | Faber | |
| 5,349,174 A | 9/1994 | Van Berkel et al. | |
| 5,686,931 A | 11/1997 | Fuenfschilling et al. | |
| 6,198,507 B1 | 3/2001 | Ishigami | |
| 6,263,102 B1 | 7/2001 | Jaspers | |
| 6,323,901 B1 | 11/2001 | Ukita | |
| 6,384,458 B1 * | 5/2002 | Bode et al. .................... | 257/431 |
| 6,388,709 B1 * | 5/2002 | Kobayashi et al. ........... | 348/362 |

(Continued)

FOREIGN PATENT DOCUMENTS

| | | |
|---|---|---|
| DE | 693 16 261 T2 | 7/1998 |
| DE | 691 31 076 T2 | 10/1999 |

(Continued)

OTHER PUBLICATIONS

English translation of Official Communication issued in corresponding International Application PCT/EP2011/059820, mailed on Jan. 3, 2012.

(Continued)

*Primary Examiner* — Yogesh Aggarwal
(74) *Attorney, Agent, or Firm* — Keating & Bennett, LLP

(57) ABSTRACT

A color image sensor having a plurality of sensor elements arranged in a two-dimensional array, wherein the sensor elements each include an optical filter whose transmission behavior is electrically adjustable, and wherein the color image sensor includes a control for controlling the optical filters.

10 Claims, 4 Drawing Sheets

(56) References Cited

U.S. PATENT DOCUMENTS

| | | |
|---|---|---|
| 6,458,492 B1 | 10/2002 | Kraft |
| 7,030,917 B2 | 4/2006 | Taubman |
| 7,105,371 B2 | 9/2006 | Fossum et al. |
| 7,583,418 B2 | 9/2009 | Mestha et al. |
| 7,667,748 B2 | 2/2010 | Kono |
| 8,164,662 B2 | 4/2012 | Rueckert et al. |
| 2006/0274189 A1 | 12/2006 | Mouli |

FOREIGN PATENT DOCUMENTS

| | | |
|---|---|---|
| DE | 100 18 444 A1 | 7/2001 |
| DE | 698 01 978 T2 | 4/2002 |
| DE | 697 12 969 T2 | 1/2003 |
| DE | 696 26 970 T2 | 11/2003 |
| DE | 697 29 648 T2 | 6/2005 |
| DE | 699 22 129 T2 | 11/2005 |
| DE | 10 2006 050 864 A1 | 6/2007 |
| DE | 10 2006 038 646 A1 | 2/2008 |
| DE | 10 2006 013 810 B4 | 6/2009 |
| EP | 0 442 738 A2 | 8/1991 |
| EP | 1 024 400 B1 | 8/2000 |

OTHER PUBLICATIONS

Official Communication issued in International Patent Application No. PCT/EP2011/059820, mailed on Dec. 27, 2011.

* cited by examiner

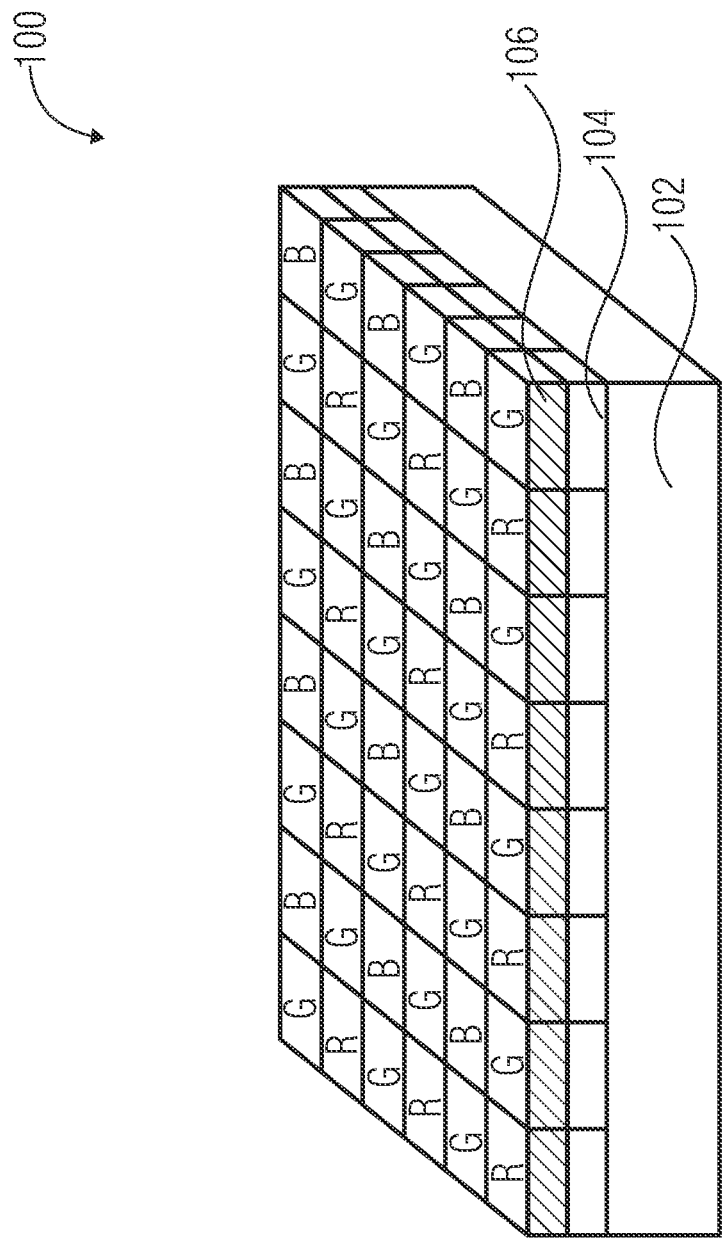

COLOR IMAGE SENSOR

CROSS-REFERENCE TO RELATED APPLICATIONS

This application is a continuation of copending International Application No. PCT/EP2011/059820, filed Jun. 14, 2011, which is incorporated herein by reference in its entirety, and additionally claims priority from German Application No. DE 102010030108.6, filed Jun. 15, 2010, which is also incorporated herein by reference in its entirety.

BACKGROUND OF THE INVENTION

The present invention relates to a color image sensor having a plurality of a sensor element and associated filters.

When manufacturing or producing color image sensors, which are used in the field of consumer electronics, in the industrial field, in the field of medical technology and in the field of cinema and television, mainly CMOS image sensors are used, whose image points (pixels) are provided with individual or planar color filters, mainly red, green and blue. Subsequently, the color filters can no longer be altered in their characteristics.

Known color image sensors have invariable color filters and comprise a plurality of sensor elements (pixel), which are arranged on a substrate. Every sensor element (pixel) is provided with a color filter, wherein the color filters of a plurality of sensor elements can be arranged to form a Bayer filter mask. The Bayer filter mask consists of 50% green, one quarter (25%) red and one quarter (25%) blue color filters. The color filter distribution considers the higher sensitivity of the human eye with regard to green hues. Further examples of color image sensors can be found in DE 69 712 969 T2, DE 69 131 076 T2, DE 69 316 261 T2 and DE 69 626 970 T2. In the color image sensors shown there, only one color value each is available for every image point (pixel) of the color image sensor. The two missing pieces of color information have to be determined by interpolation with the help of the adjacent image points (pixel). The main problem is now to find suitable interpolation algorithms which are, on the one hand, realizable, and which can, on the other hand, accurately detect and reconstruct, for example, edges up to the resolution limit.

For evaluating data, a high number of possible methods exist. Examples can be found in DE 69 729 648 T2, DE 102 006 038 646 A1, DE 69 922 129 T2 and DE 102 006 013 810 B4. Further, the application of suitable interpolation algorithms aims to correct erroneous image points (pixels) as well as to accurately detect and reconstruct edges. This is described, for example, in DE 102 006 050 864 and DE 69 801 978 T2. Further, image reproduction devices exist having multilayered LCD filters allowing an adjustment of the transmission for all three primary colors (red, green and blue) as described U.S. Pat. No. 5,686,931.

A further currently used method is based on the usage of several (mainly three) sensor elements together with a beam splitter and different planar color filters (mainly red, green and blue) in front of one sensor element each. This embodiment provides all necessitated color information for each image point (pixel). However, this embodiment necessitates a lot of effort, is expensive and necessitates a lot of space. Further, optical problems caused by the beam splitter complicate the usage. For example, the beam splitter can cause chromatic aberration.

Caused by production tolerances and processes such as aging and thermal impact, the characteristics of the individual image points (pixels) of the color image sensor can change. Particularly in high-quality color image sensors for film and TV, it is desirable to compensate this effect. However, calibration is frequently very expensive since, at first, the color image sensor has to be exposed to images of different brightness and evenly illuminated images. From the captured images, correction values for amplification, offset and linearization can be calculated for every individual image point (pixel). To ensure optimum quality of the color image sensor at any time, camera users have to be able to perform recalibration in the field. Since, however, exact illumination of several different images and different manual interventions are necessitated for calibration, recalibration is normally avoided. The effort and the risk of useless images after erroneous recalibration are too high.

A further problem when using digital image sensors is the limited dynamic range. Currently, image sensor producers try to expand the dynamic range of the image sensors by different technologies which, however, normally involve tradeoffs. The applied methods either result in temporal or local blur.

SUMMARY

An embodiment of the invention may have a color image sensor including a plurality of sensor elements arranged in a two-dimensional array, wherein the sensor elements each include an optical filter whose transmission behavior is electrically adjustable based on an electro-optical effect, and wherein the color image sensor includes a control for controlling the optical filters, wherein the transmission behavior of the optical filters is electrically adjustable in a wavelength-selective manner, wherein the control is implemented to control the optical filters such that a definable wavelength range is prioritized during operation; and wherein the control is implemented to recognize contiguous areas of sensor elements detecting light in a wavelength range, wherein the control is implemented to control the optical filters in this area to prioritize the wavelength range.

The invention provides a color image sensor having a plurality of sensor elements arranged in a two-dimensional array, wherein the sensor elements each comprise an optical filter whose transmission behavior is electrically adjustable and wherein the color image sensor comprises a control for controlling the optical filters.

In embodiments of the invention, each sensor element of the color image sensor is provided with a variable and dynamically configurable optical filter, whose transmission behavior is electrically adjustable in order to adapt, for example, the sensitivity of the color image sensor to the exposure situations. Further, in embodiments of the invention, the transmission behavior of the optical filters can be electrically adjusted in a wavelength-selective manner in order to determine, for example, which wavelengths (color components) are allowed to pass the respective sensor element with what transmission. These settings can be made differently and in a time variable manner for each sensor element. This enables, for example, the usage of a color matrix (color filter mask) which can be changed from image to image. In that way it is possible to influence the characteristic of the color image sensor before the image detected by the sensor elements is converted into electrical signals, and this can take place continuously during operation and individually for each image point (pixel).

BRIEF DESCRIPTION OF THE DRAWINGS

Embodiments of the present invention will be detailed subsequently referring to the appended drawings, in which:

FIGS. 3a and 3b is the color image sensor of FIG. 1, wherein the optical filters arranged in a two-dimensional array are controlled by the control such that a variable Bayer filter mask results.

DETAILED DESCRIPTION OF THE INVENTION

Figure 1:
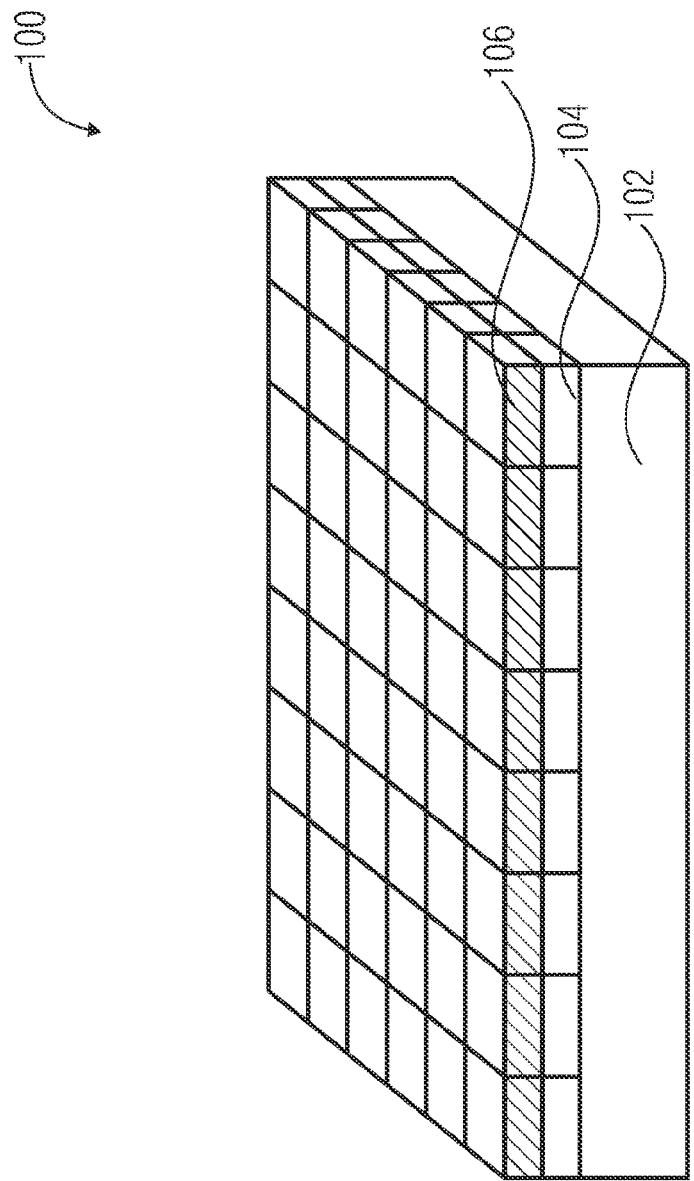
FIG. 1 is a schematic side view of an embodiment of an inventive color image sensor.

FIG. 1 shows a schematic side view of an embodiment of an inventive color image sensor 100. A plurality of sensor elements 104 is arranged in a two-dimensional array on a substrate 102. Each sensor element 104 is provided with an optical filter 106, whose transmission behavior is electrically adjustable. Further, the optical filter can be implemented such that the transmission behavior is electrically adjustable in a wavelength-selective manner. The sensor elements 104 can, for example, be implemented as CMOS image sensors, while the optical filters can be based, for example, on LCD technology. The control for controlling the optical filters 106 can, for example, be integrated into the substrate 102, wherein a via can be used for contacting the optical filters 106 with the control.

Apart from using optical filters based on LCD modules, for example, modules for LCD projectors, which are normally adhered directly onto the sensor elements with highly transparent silicon resins and a specific technology for void-free adhesion, there is the option of depositing individual image points (pixels) of an LCD module (Schadt-Helfrich-cell) and the control (control electronic) directly onto the sensor surface. Here, it is advantageous to deposit the color filters directly onto the silicon die during production of the image sensors without any special additional method steps. Further, realization with the help of microsystems technology, such as micro mirrors, is possible. Further, the optical filters can be deposited directly onto the semiconductor. This becomes possible by the usage of electro-optical effects in the semiconductor, such as the Franz-Keldysh effect or the Quantum-Stark effect (QCSE). Alternative implementations of electrically controllable filters are known to persons skilled in the field of optoelectronics.

Figure 2:
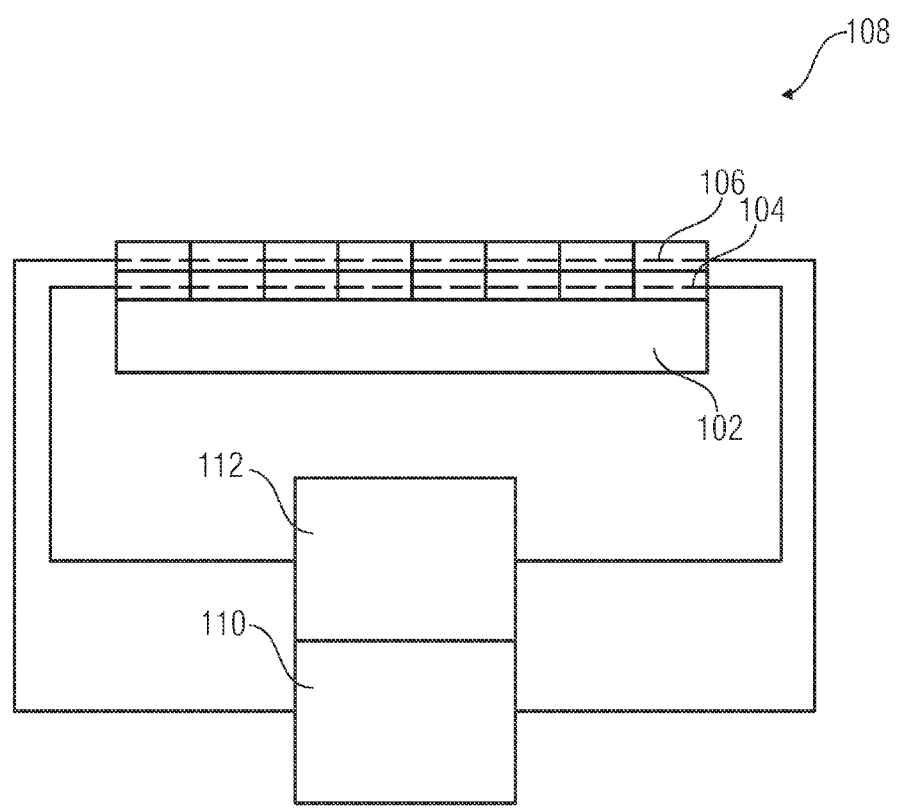
FIG. 2 is a schematic side view of alternative embodiment of an inventive color image sensor.

FIG. 2 shows a schematic side view of an alternative embodiment of an inventive color image sensor 108 similar to the one shown in FIG. 1, wherein the control 110 for controlling the optical filters 106 and the electronic circuit 112 for reading out the sensor element 104 are illustrated schematically. In embodiments, the control can be integrated at least partly into the substrate or can be implemented externally. The control 110 of the optical filters 106 can be implemented to decide, for example, whether the color matrix is changed from image to image, whether the transmission of the optical filter 106 is reduced in an overexposed sensor element 104, or whether more original values from two subsequent images with different color image filter masks are used for calculating the overall image.

Figure 3A:
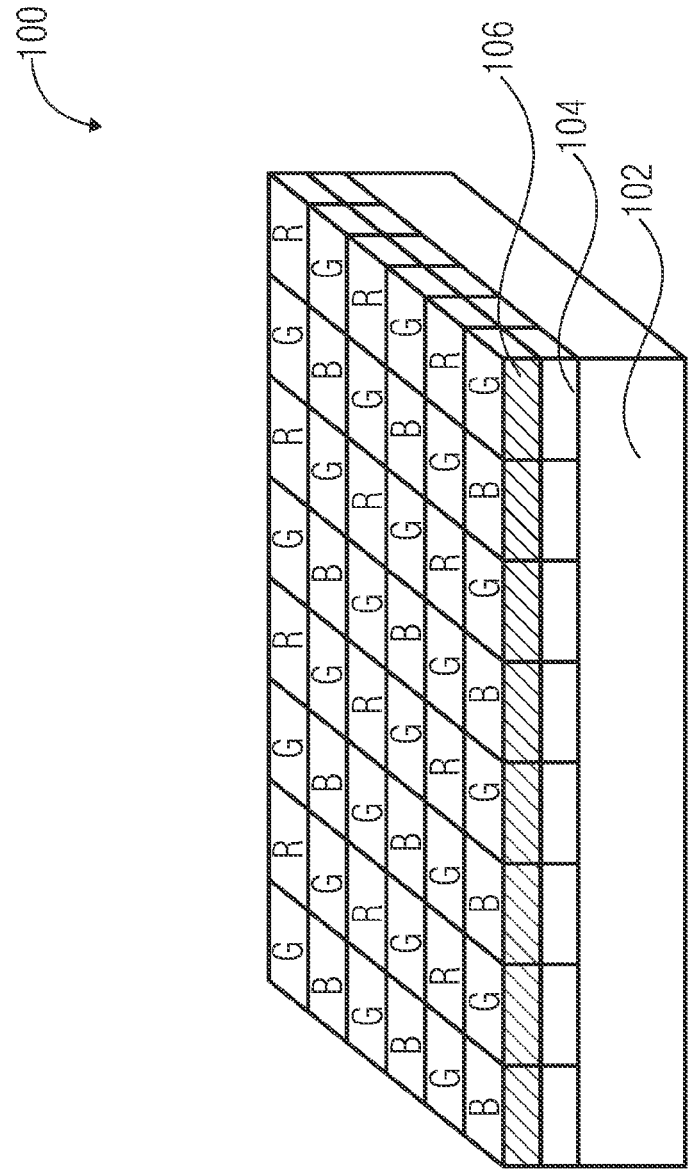

FIGS. 3a and 3b show the color image sensor 100 of FIG. 1, wherein the optical filters 106 arranged in a two-dimensional array are controlled by the control such that a variable Bayer filter mask results. The Bayer filter mask shown in FIG. 3a can, for example, be used to detect a first image, while an amended Bayer filter mask according to FIG. 3b can be used for detecting a second image. Due to the fact that the Bayer filter mask can be changed from image to image or can be configured as arbitrary pattern or can be illustrated in a fixed sequence (for example in a sequence of twos/threes or with twofold/threefold frame rate) a complete color occupation of every image point (pixel) results, which results in simple subsequent filtering and avoidance of regular structures. In that way, by using a flexible color filter mask, the rendering algorithms can provide significantly better results.

In the field of scenic film and cinema production, the cameraman or film makers want digital image sensors to convey a similar image impression as the classical film reel. Particularly the grain of the classical film reel should be reproducible. The inventive color image sensor enables emulation of the film grain, for example by varying the color filter mask.

The fields of application for color image sensors having a variable color filter mask are manifold. The usage of the inventive color image sensors enables improvements of the image quality in all areas. Particularly in the field of industrial camera systems, film and TV cameras and special applications such as aerospace or automotive, the inventive color image sensors can help to make significant improvements and partly enable the usage in the first place.

An adjustable transmission of the optical filters allows to significantly increase the dynamic range of the color image sensor. In overexposed image points (pixels), for example, the filter strength can be increased, and in underexposed image points (pixels) the same can be lowered. The overall brightness results from the sum of filter strength and pixel brightness (overall brightness=filter strength+pixel brightness). At a filter resolution of, for example, 8 Bit, an extension of the dynamic range by 4 bits is possible. Thereby, image sensors become possible which can be used for object detection in vehicles and guarantee safe detection even with light, counter light, darkness or fog together with fast movements. Since the inventive color image sensor functions without movable mechanical components, the same is small, robust and cost effective.

Further, the color filter mask of the inventive color image sensor can be dynamically adapted, for example, the wavelength selectivity of the optical filter can be shifted to blue in blue areas and to red in red areas. This advantage is applied, for example, in medical technology. Particularly in endoscopes, the color image sensors have to offer maximum richness of detail in the images in the field of skin colors and shades of red for the examining physician for a safe diagnosis, wherein obviously all other colors still have to be represented correctly. Here, according to the situation, an adaptive color filter mask can help to prioritize shades of red especially. In this regard, the following approach is advantageous: First, an image is captured with an evenly distributed red/green/blue color filter mask. Subsequently, the filter mask is adapted towards the next image according to the findings gained from the first image. Within areas having shades of red, the wavelength selectivity of the optical filter can be shifted towards more red image points (pixels) in the second image. In summary, a detailed color image having particularly fine shades of red results. Also, adaptive adaptation of the transmission would enormously help to increase the dynamic range in a difficult illumination situation and, hence, support the doctor in assessing the image material.

Further, the variable optical filter of the inventive color image sensors allows automatic calibration of the image points (pixels). With dismantled objective, the incident amount of light can be automatically set and hence the necessitated images of different brightness can be captured. In normal operation, the optical filter of the inventive color image sensor can again update the red/green/blue color matrix and increase the dynamic range in difficult illumination situations.

Further, the usage of variable and dynamically configurable optical filters provides improvements regarding white balance and simpler detection and reconstruction of edges. Further, the usage of secondary colors (magenta, cyan, yellow) as well as white/black in the filter mask of the inventive color image sensor is possible. The examples for applications can be continued from the already mentioned fields automotive, film and TV, medical technology to aerospace, autonomous systems, security technology up to multimedia, games and consumer electronics. The technology can be expanded to other markets and further applications, in particular when the need for improvement of image quality or dynamic range is necessitated or enables the usage of a camera in the first place.

In further embodiments, the color image sensor can comprise a plurality of the sensor elements arranged in a two-dimensional array, wherein the sensor elements each comprise an optical filter whose transmission behavior is electrically adjustable, and wherein the color image sensor comprises a control for controlling the optical filters.

In further embodiments, the transmission behavior of the optical filters is electrically adjustable in a wavelength-selective manner.

In further embodiments, the control can be implemented to adjust the optical filters such that the same form a color matrix.

In further embodiments, the control can be implemented to change the color matrix from one captured image to the next captured image.

In further embodiments, the color matrix can form a Bayer filter mask.

In further embodiments, the optical filters can comprise an adjustable transmission coefficient.

In further embodiments, the color image sensor can comprise a control that is implemented to reduce the transmission coefficient in overexposed sensor elements and/or increase the same in underexposed sensor elements.

In further embodiments, the control can be implemented to control the optical filter such that a definable wavelength range is prioritized during operation.

In further embodiments, the control can be implemented to control the optical filters in a captured image to allow the defined wavelength range to pass and to at least partly control the optical filters in a next captured image to allow other wavelength ranges to pass.

In further embodiments, the control can be implemented to recognize contiguous areas of sensor elements detecting light in a wavelength range, wherein the control is implemented to control the optical filters in this area to prioritize the wavelength range.

In further embodiments, the control can be implemented to control the optical filters to emulate a film grain.

In further embodiments, the transmission behavior of the optical filter(s) is adjustable such that the primary colors red, green and blue, the secondary colors magenta, cyan and yellow, mixed colors or white/black are allowed to pass.

In further embodiments, the control can be implemented to control the optical filters based on calibration data captured with dismantled objective.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A color image sensor comprising:
a plurality of sensor elements arranged in a two-dimensional array; wherein
the sensor elements each include an optical filter whose transmission behavior is electrically adjustable based on an electro-optical effect;
the color image sensor includes a control implemented to control the optical filters;
the transmission behavior of the optical filters is electrically adjustable in a wavelength-selective manner;
the control is implemented to control the optical filters such that a definable wavelength range is prioritized during operation;
the control is implemented to recognize contiguous areas of sensor elements detecting light in one wavelength range; and
the control is implemented to control the optical filters of the recognized contiguous areas of sensor elements based on the one wavelength range, in order to prioritize the one wavelength range in the recognized contiguous areas.

2. The color image sensor according to claim 1, wherein the control is implemented to adjust the optical filters such that the same form a color matrix.

3. The color image sensor according to claim 2, wherein the control is implemented to change the color matrix from one captured image to the next captured image.

4. The color image sensor according to claim 2, wherein the color matrix forms a Bayer filter mask.

5. The color image sensor according to claim 1, wherein the optical filters include an adjustable transmission coefficient.

6. The color image sensor according to claim 5, further comprising a second control implemented to reduce the transmission coefficient in overexposed sensor elements and/or to increase the same in underexposed sensor elements.

7. The color image sensor according to claim 1, wherein the control is implemented to control the optical filters in a captured image to allow the one wavelength range to pass and to at least partly control the optical filters in the next captured image to allow other wavelength ranges to pass.

8. The color image sensor according to claim 2, wherein the control is implemented to control the optical filters to emulate a film grain by a variation of the color filter mask.

9. The color image sensor according to claim 1, wherein the transmission behavior of the optical filter(s) is adjustable such that the primary colors red, green, blue, the secondary colors magenta, cyan and yellow, mixed colors or white/black are allowed to pass.

10. The color image sensor according to claim 1, wherein the control is implemented to control the optical filters based on calibration data captured with dismantled objective.

* * * * *